United States Patent [19]

Imanari et al.

[11] 4,051,429
[45] Sept. 27, 1977

[54] NUCLEAR MAGNETIC RESONANCE APPARATUS

[75] Inventors: Mamoru Imanari; Makoto Takeuchi; Shozo Shimizu; Hisashi Higuchi, all of Tokyo, Japan

[73] Assignee: Nihon Denshi Kabushiki Kaisha, Tokyo, Japan

[21] Appl. No.: 654,527

[22] Filed: Feb. 2, 1976

[30] Foreign Application Priority Data

Feb. 4, 1975  Japan .................. 50-14663
Mar. 17, 1975  Japan .................. 50-32051
Mar. 18, 1975  Japan .................. 50-32705

[51] Int. Cl.$^2$ .............................. G01R 33/08
[52] U.S. Cl. ..................... 324/.5 A; 324/.5 R
[58] Field of Search ............ 324/.5 R, .5 A, .5 AC

[56] References Cited

U.S. PATENT DOCUMENTS

| | | | |
|---|---|---|---|
| 3,699,428 | 10/1972 | Leane | 324/.5 R |
| 3,720,816 | 3/1973 | Keller | 324/.5 A |
| 3,777,254 | 12/1973 | Kleiman | 324/.5 A |
| 3,873,909 | 3/1975 | Ernst | 324/.5 A |
| 3,886,439 | 5/1975 | Laukien | 324/.5 AC |

*Primary Examiner*—M. Tokar
*Attorney, Agent, or Firm*—Webb, Burden, Robinson & Webb

[57] ABSTRACT

A nuclear magnetic resonance apparatus incorporating a first trans-receiver coil, an internal lock coil, a decoupling coil, means for tuning said coils to desired frequencies, a first trans-receiving system for supplying the first trans-receiver coil with a first nuclear (such as $^1H$) resonance RF wave and detecting the first nuclear resonance F.I.D. signal, a second trans-receiving system for supplying the first trans-receiving coil with a second nuclear (such as $^{13}C$) resonance RF wave and detecting the second nuclear resonance F.I.D. (Free Inductance Decay) signal, a third trans-receiving system for supplying the internal lock coil with a third nuclear (such as $^2D$) resonance RF wave and detecting the third nuclear resonance signal, and a transmission system for supplying the first nuclear resonance RF wave to the decoupling coil, it being possible in said apparatus to observe different types of nucleus, viz; $^1H$ and $^{13}C$ without removing the internal lock by employing a third nucleus such as $^2D$ so that the first and second nuclear spectrum can be observed at high resolution by first nuclear decoupling.

15 Claims, 21 Drawing Figures

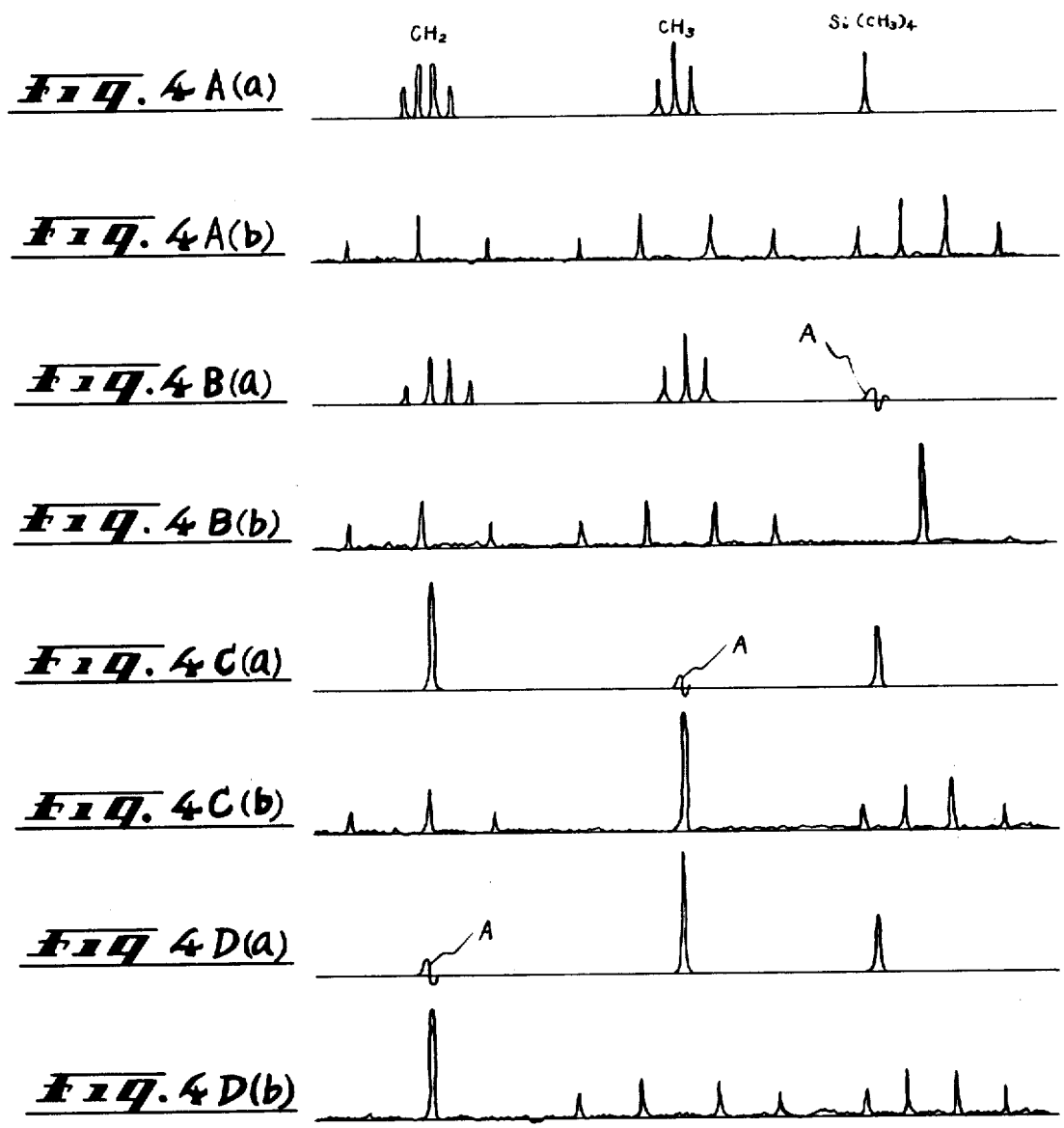

NUCLEAR MAGNETIC RESONANCE APPARATUS

DETAILED DESCRIPTION OF THE INVENTION

Figure 1:
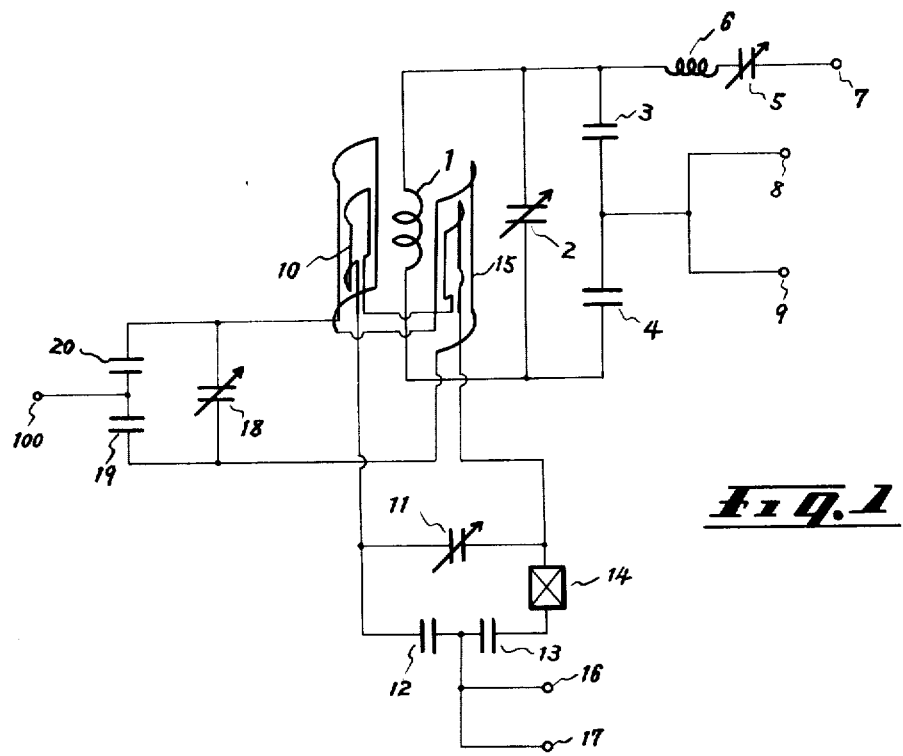

This invention relates to nuclear magnetic resonance apparatus particularly pulsed Fourier Transform nuclear magnetic resonance apparatus capable of facilitating the observation of other than proton nuclei as well as proton nuclei at high resolution.

The development of the pulsed Fourier Transform method has contributed immensely in enhancing the capability of nuclear magnetic resonance apparatus. In fact, nuclear magnetic resonance apparatus incorporating this method is now widely used for observing the $^1H$, $^{13}C$ and other nuclei forming a constituent part of organic compounds. F.T.N.M.R. is especially useful in the observation of the $^{13}C$ nucleus since it is low in natural abundance, has a moderate relaxation time and is characterized by a large chemical shift.

In order to make the spectrum as simple as possible and maximize the detection sensitivity, a technique whereby all the hydrogen nuclei are decoupled while observing the $^{13}C$ nucleus is currently in common use.

Now, if instead of decoupling all the hydrogen nuclei, the group of $^1H$ nuclei identified from the $^1H$ nuclear resonance spectrum having the same chemical shift are individually decoupled while observing the $^{13}C$ nucleus, the mutual relationship of the respective $^1H$ and $^{13}C$ nuclei (i.e., which $^{13}C$ nucleus combines with which $^1H$ nucleus) will become readily apparent, thus increasing, to a marked degree, the amount of information available on the structural determination of compounds. Moreover, since $^1H$ and $^{13}C$ are the major nuclei constituting organic compounds, it is possible to determine the structure of a given sample with remarkable accuracy, by obtaining information on the mutual relativity of said nuclei.

In the prior art, in order to obtain this type of information, it is necessary to first of all measure the resonance frequency of the $^1H$ nucleus with an $^1H$ nuclear resonance instrument and then measure the resonance frequency of the $^{13}C$ nucleus by decoupling all the hydrogen nuclei with the aid of a $^{13}C$ nuclear resonance instrument. Afterwhich, portional decoupling of the hydrogen nuclei must be carried out by trial and error while referring to the spectrum of the hydrogen nucleus. All in all, this entails great effort and is cumbersome and time consuming procedure to say the least. That is to say, in the prior art, in order to observe both the $^1H$ and the $^{13}C$ nucleus, two separate instruments are necessary. Even if the two instruments are combined to form one unit, a separate detector is usually necessary. Moreover, even in the case of a common detector or so-called universal probe, the sample coil and matching unit has to be replaced; in addition to which, electrical adjustments are necessary. This means that in order to effect NMR control, it is required to remove the control lock when changing over from one resonance nucleus to another. Furthermore, when observing the $^{13}C$ nucleus since the signal intensity is weak, it is difficult to adjust the magnetic field uniformity or resolution by means of the observation signal itself. Such being the case, adjustment is generally carried out by using the signal of the heavy hydrogen nucleus as an internal lock signal.

However, since the heavy hydrogen nucleus has a nuclear spin $I = 1$, the resonance line width due to the relaxation effect of the nuclear quadrupole may not be sufficiently narrow for adjusting the resolution to a degree sufficient to measure a nucleus of extreme narrow natural line width such as the $^{13}C$ or $^1H$ nucleus which has a nuclear spin $I = \frac{1}{2}$.

The signal resultant upon $^1H$ nuclear resonance is, in itself, quite strong so that if a suitable sample is used, said signal would prove ideal for adjusting the resolution. Accordingly, if, immediately after carrying out hydrogen nuclear resonance resolution adjustment with $^2D$ nucleus NMR lock condition retained, the $^{13}C$ nucleus can be observed with absolutely no change in instrument conditions, it is possible to observe the $^{13}C$ nucleus at optimum resolution.

Furthermore, changeover from hydrogen nuclear resonance observation to $^{13}C$ nuclear resonance observation can be carried out at any time without any drop in resolution; moreover, if the $^{13}C$ nucleus and $^1H$ nucleus can be measured under common magnetic field conditions, it is possible to observe a partially decoupled spectrum while confirming that the $^{13}C$ nucleus correlates with the $^1H$ nucleus.

Based upon and in consideration of the aforegoing, this invention offers a pulsed Fourier Transform nuclear magnetic resonance apparatus designed to effect $^{13}C$ and $^1H$ nuclear resonance with extreme ease by maintaining internal lock conditions with the aid of a heavy hydrogen nucleus, said apparatus also being capable of easily and accurately decoupling homologous muclei in the case of hydrogen nuclear resonance, and partially decoupling the $^1H$ nucleus in the case of $^{13}C$ nuclear resonance.

Figure 2:
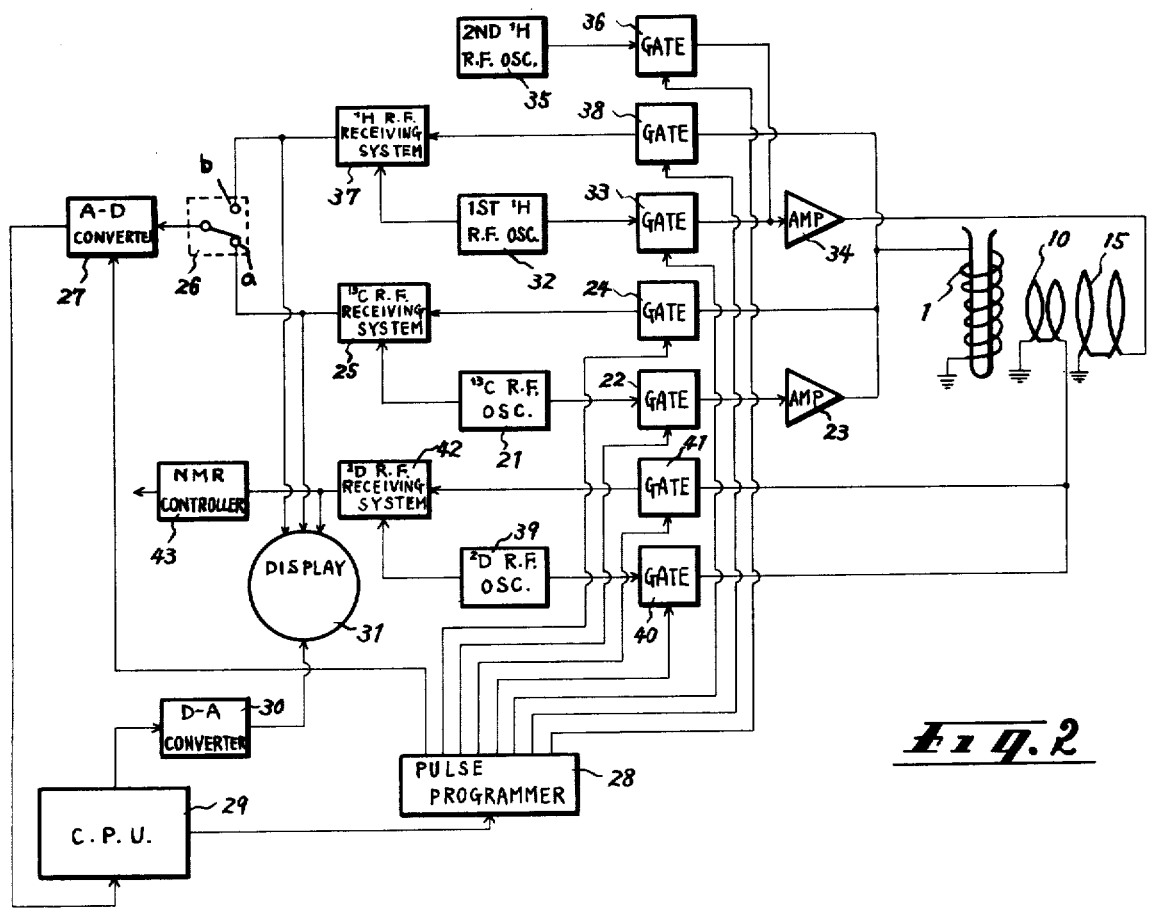
Figure 5:
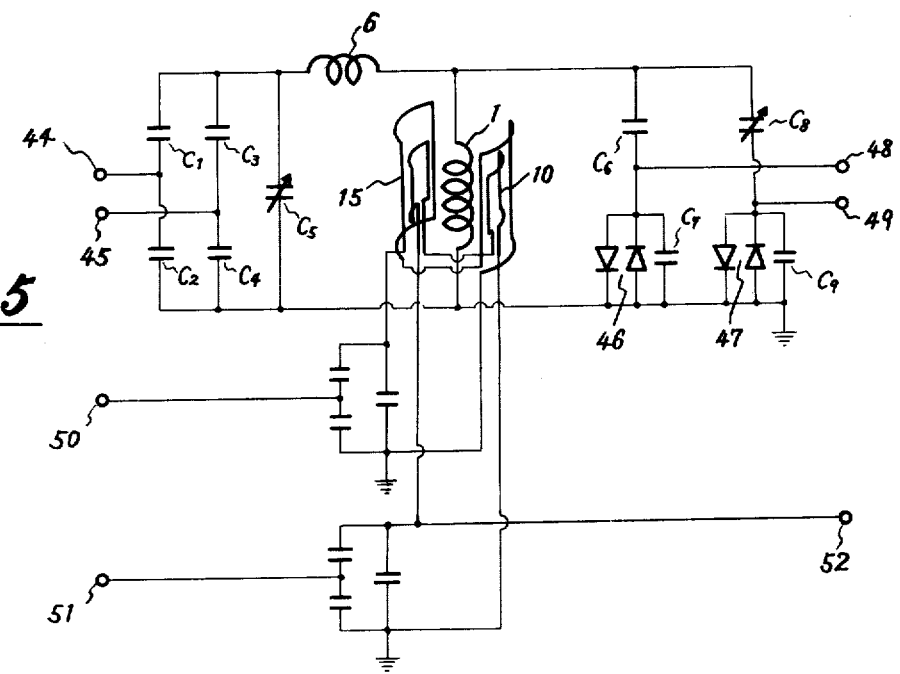
Figure 6:
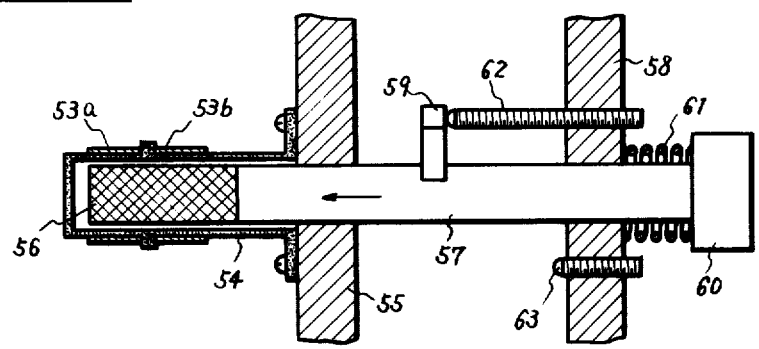
Figure 7:
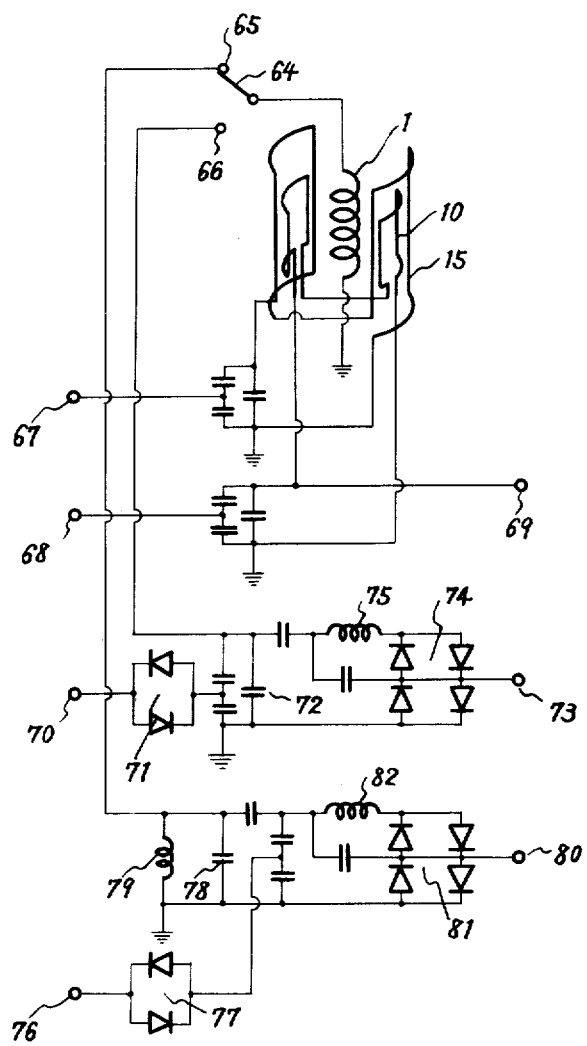
Figure 8:
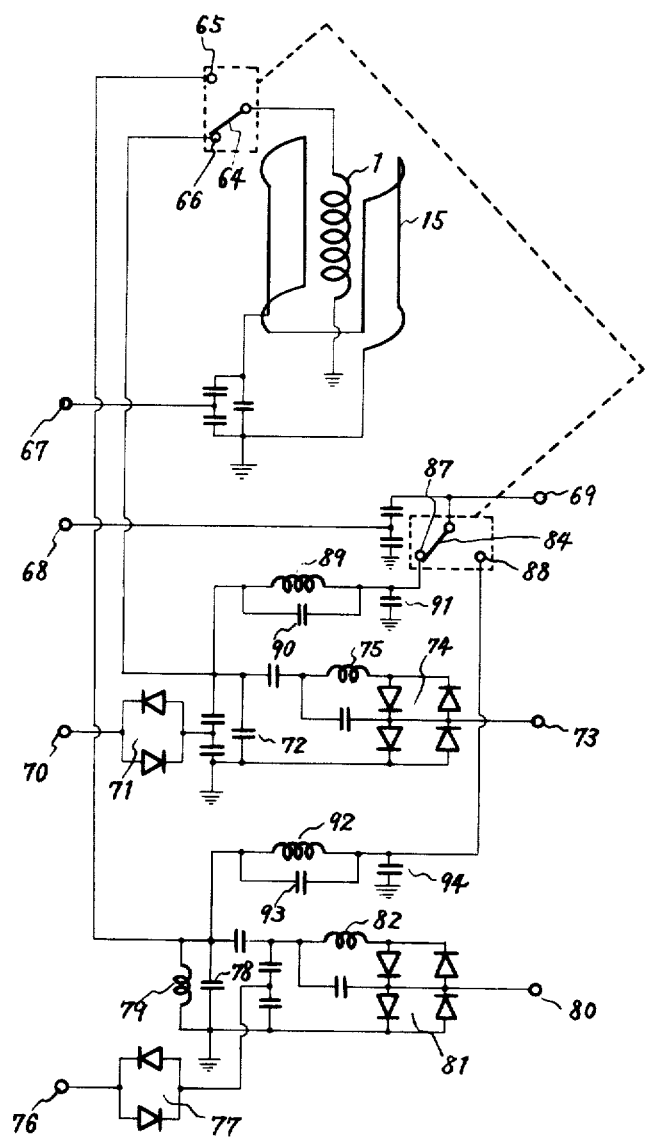

These and other features and advantages will become more readily apparent by reading through the following detailed description of the present invention in conjunction with the accompanying drawings in which, FIG. 1 shows one embodiment of the probe used in this invention, FIG. 2 shows one embodiment of this invention incorporating the probe shown in FIG. 1, FIG. 3 shows gate signals supplied to gate circuits and A-D conversion instruction signals supplied to A-D converters, FIG. 4 shows spectrum lines used for explaining the present invention, FIG. 5 shows another embodiment of the probe used in this invention, FIG. 6 shows a cross-section of condenser in the embodiment shown in FIG. 5, and FIGS. 7 and 8 show other embodiments of the probe used in this invention, respectively.

Referring to the FIG. 1, a trans-receiver coil 1 is made of non-magnetic material, said coil being arranged perpendicularly with respect to the static magnetic field $H_0$. The inductance of trans-receiver coil 1 is selected to produce optimum $^{13}C$ nuclear resonance. Condensers 2, 3, 4 and 5 are for double tuning the trans-receiver coil, and compensating coil 6 is for tuning the $^1H$ resonance frequency. The trans-receiver coil 1 is connected to an $^1H$ resonance frequency receiving system via terminal 7 and is further connected to a $^{13}C$ resonance frequency transreceiving system via terminals 8 and 9. A pair of $^2D$ resonance frequency trans-receiver coils 10, arranged in close proximity to coil 1, are interposed along a third axis perpendicular to both the static magnetic field $H_0$ and trans-receiver coil 1 axes, the length of said coils 10 being roughly the same as coil 1. Condensers 11, 12 and 13 are for tuning the trans-receiver coils 10 to the $^2D$ nuclear resonance frequency, and trap circuit 14 tuned to the $^1$H nuclear resonance frequency, is for blocking the reception and transmission of $^1$H nuclear resonance frequency signals generated by $^1$H resonance frequency transmission coils 15 arranged along the same axis as the trans-receiver coils 10. Terminals 16 and 17 serve to connect coils 10 with a $^2$D nuclear resonance frequency trans-receiving system, and terminal 100 serves to connect transmission coils 15 to an $^1$H nuclear resonance frequency transmitting system. To ensure that the spatial magnetic field in which the sample is arranged is highly uniform, transmission coils 15 are arranged so as to envelope the trans-receiver coil 1. Condensers 18, 19 and 20 are tuning condensers.

FIG. 2 shows one embodiment of this invention incorporating the probe as described above. Referring to FIG. 2, $^{13}$C resonance frequency oscillator 21 supplies a $^{13}$C resonance high frequency signal to the trans-receiver coil 1 via a gate circuit 22 and an amplifier 23. The oscillator 21 also supplies a $^{13}$C resonance high frequency signal to a $^{13}$C resonance frequency receiving system 25 which is connected to the trans-receiver coil 1 via a gate circuit 24. Thus, the $^{13}$C resonance signal picked up by the trans-receiver coil 1 is amplified and detected in accordance with the signal supplied from the oscillator 21. When changeover switch 26 is positioned at "a", the output signal from the $^{13}$C resonance frequency receiving system 25 is fed into an A-D converter 27 where the signal is A-D converted according to the timing signal from a pulse programmer 28. The A-D converter 27 output signal is then supplied to a C.P.U. (Central Processing Unit) 29 where Fourier transformation, etc. takes place. Then, the processed signal is supplied to a display means 31 via a D-A converter 30. $^1$H resonance frequency oscillator 32 supplies an $^1$H resonance frequency signal to transmission coils 15 via gate circuit 33 and amplifier 34. The high frequency output signal from a second $^1$H resonance frequency oscillator 35 can also be supplied via gate circuit 36 and amplifier 34 or directly via gate circuit 36 to the transmission coils 15 when observing the $^1$H nucleus by homodecoupling. The $^1$H resonance frequency oscillator 32 also supplies a resonance frequency receiving system 37 which is connected to the trans-receiver coil 1 via gate circuit 38. Thus, the $^1$H resonance F.I.D. (Free Induction Decay) signal picked up by the trans-receiver coil 1 is amplified and detected in accordance with the signal supplied from the oscillator 32. When changeover switch 26 is positioned at "b", the output signal from the $^1$H resonance frequency receiving system 37 is fed into C.P.U. 29 via A-D converter 27. $^2$D resonance frequency oscillator 39 supplies $^2$D resonance frequency trans-receiver coils 10 via gate circuit 40. The oscillator 39 also supplies $^2$D resonance frequency signal to a $^2$D resonance frequency receiving system 42, said receiving system 42 being connected to said trans-receiver coils 10 via gate circuit 41. Thus, the $^2$D resonance signal picked up by the trans-receiver coils 10 is amplified and detected in accordance with the oscillator 39 output signal. The output of the $^2$D resonance frequency receiving system 42 is supplied to an N.M.R controller 43. Further, by supplying the output signal of said N.M.R. controller to a flux stabilizer (not shown), the feedback is controlled so as to prevent the static magnetic field from fluctuating. The gate signals from the pulse programmer 28 open and close gate circuits 22, 24, 33, 36, 38, 40 and 41, the timing of said gate signals being set by the output signal of C.P.U. 29 or by a time setter built into the pulse programmer 28. Moreover, the output terminals of receiving systems 25, 37 and 42 are connected to the display means 31 so that the respective output signals of said receiving system can be directly displayed without being processed.

Figure 3A:
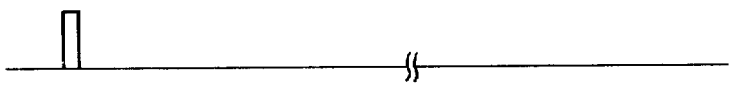
Figure 3B:
Figure 3C:
Figure 3D:
Figure 3E:

The following is a description of the observation of measuring and standard sample signals using the above described embodiment. In this case, the measuring sample was ethyl ether $(CH_3CH_2)_2O$, the standard sample tetra methyl silane (T.M.S.) and the solvent deuterated chloroform $(CDCl_3)$. If it is desired to observe $^1$H by the Pulse Fourier Transform method, it will first of all be necessary to position changeover switch 26 at "b". Then, by supplying a gate signal, as shown in FIG. 3(a), from the pulse programmer 28 to gate circuit 33, said gate circuit is opened and an $^1$H gyromagnetic resonance radio frequency signal from the $^1$H resonance frequency oscillator 32 is supplied to transmission coils 15 as a train of RF pulses to irradiate the sample intermittently. Immediately after sample irradiation, gate circuit 38 opens and the F.I.D. signal picked up by the trans-receiver coil 1 is supplied to the $^1$H resonance frequency receiving system 37 where it is amplified and detected. The detected output signal from the receiving system 37 is then supplied to A-D converter 27 and, after being converted into a digital signal, is supplied to C.P.U. 29 where Fourier transformation takes place. Finally, the processed signal is fed into display means 31 via D-A converter 30. The signal waveform thus displayed is as shown in FIG. 4A(a). Concomitantly, the unprocessed F.I.D. signal amplified and detected by the receiving system 37 is directly fed into the display means 31, thus enabling resolution coarse adjustment to be carried out while observing the free induction decay characteristics on the screen. Next, by supplying a gate signal as shown in FIG. 3(d), from the pulse programmer 28 to gate circuit 40, said gate circuit is opened and a radio frequency signal from the $^2$D resonance frequency oscillator 39 is supplied to trans-receiver coils 10. Now, by supplying a gate signal as shown in FIG. 3(e) from the pulse programmer 28 to gate circuit 41 immediately after supplying the radio frequency signal from the oscillator 39, a $^2$D gyromagnetic resonance signal is supplied to the $^2$D resonance frequency receiving system 42 from trans-receiver coils 10 where it is amplified and detected prior to being sent to the NMR controller 43.

On the other hand, the output signal from the receiving system 42 is directly fed into the display means 31, and a dispersion waveform is displayed.

Now, by beginning to supply the flux stabilizer (not shown) with the output signal from the NMR controller 43 while observing the dispersion waveform displayed in the display means 31, the so-called $^2$D NMR lock condition is effected. After completing the above, the $^1$H observation procedure is repeated and resolution fine adjustment is carried out.

Figure 3F:

Next, in order to observe the $^{13}$C nucleus by $^1$H non-decoupling, first of all position changeover switch 26 at "a". Then, by supplying a gate signal, as shown in FIG. 3(f), from the pulse programmer 28 to gate circuit 22, said gate circuit is opened and a $^{13}$C resonance radio frequency signal from the $^{13}$C resonance frequency oscillator 21 is supplied to the trans-receiver coil 1 as a train of RF pulse to irradiate the sample pulsatively. As a result of said irradiation, an F.I.D. signal is generated and, by opening gate circuit 24, said F.I.D. signal picked up by trans-receiver coil 1 is supplied to the $^{13}$C resonance frequency receiving system 25 where it is amplified and detected. The detected output signal from the receiving system 25 is then supplied to A-D converter 27 and, after being converted into a digital signal, is supplied to C.P.U. 29 where Fourier transformation takes place. Finally, the processed signal is fed into display means 31 via D-A converter 30. The signal waveform thus displayed as shown in FIG. 4A(b).

Next, $^1$H or $^{13}$C observation by $^1$H decoupling is described. To observe the $^1$H nucleus by $^1$H decoupling, it is necessary to first of all supply a gate signal with a preset pulse interval as shown in FIG. 3(b) to gate circuit 36. The pulse interval of the gate signal has been set by adjusting the flip angle while observing the $^1$H nucleus.

Figure 3G:

By so doing, gate circuit 36 opens and an $^1$H resonance radio frequency signal from the second $^1$H resonance frequency oscillator 35 is supplied to transmission coils 15 as a train of RF pulse. The coils 15, thus energized, irradiate the sample. The next thing to do is to position the changeover switch 26 at "b" and supply a gate signal as shown in FIG. 3(a) to gate circuit 33. This opens the gate circuit 33 and allows a radio frequency signal from the $^1$H resonance frequency oscillator 32 to energize transmission coils 15 and thereby irradiate the sample. The F.I.D. signal thus obtained is then picked up by the trans-receiver coil 1 and supplied to the $^1$H resonance frequency receiving system 37. The output of said receiving system then enters the A-D converter 27. At the same time, an A-D conversion instruction signal as shown in FIG. 3(c) is sent from the pulse programmer 28 to said A-D converter 27 to convert the output signal from the receiving system 37 into a digital signal in accordance with the timing of the A-D conversion instruction signal, said A-D conversion instruction signal being out of phase with the gate signal supplied to the gate circuit 36 for determining the irradiation timing of the $^1$H radio frequency decoupling wave as shown in FIG. 3(b). Accordingly, the F.I.D. signal supplied to the $^{13}$C resonance frequency receiving system 25 is not affected by the $^1$H decoupling irradiation wave leaked from the transmission coils 15 to the trans-receiver coil 1, when the F.I.D. signal is processed. Finally, the digitalized output from the A-D converter 27 is supplied to the display means 31 via C.P.U. 29 and D-A converter where it is displayed as a spectral waveform. If the oscillation frequency of the $^1$H resonance frequency oscillator 35 is made to coincide with the $^1$H resonance frequency of the Si(CH$_3$)$_4$ by finely adjusting the oscillation frequency, the spectral waveform displayed on the display means 31 will be shown as in FIG. 4B(a). That is to say, the $^1$H resonance absorption peak of the Si(CH$_3$)$_4$ disappears and, in its place, a mis-phased waveform A appears. However, so long as the apparatus is functioning under ideal condition, the waveform will be extremely small. The reason is that the waveform A is attributable to radio frequency irradiation leakage from the gate circuits, etc. and the phase of the leakage signal does not coincide with the phase of the NMR signal. The frequency of the irradiation RF pulse for decoupling can be obtained from the displayed spectrum, depending on the position of waveform A in said spectrum. Hence, when observing the $^{13}$C nucleus by selectively decoupling $^1$H of Si(CH$_3$)$_4$, the changeover switch 26 is positioned at "a" while the oscillation frequency of the second $^1$H resonance frequency oscillator 35 is maintained constant. Further, by closing gate circuit 33 and opening gate circuit 24 by supplying thereto a gate signal as shown in FIG. 3(f), a radio frequency signal from the $^{13}$C resonance frequency oscillator 21 is supplied to the trans-receiver coil 1 to irradiate the sample pulsatively. As a result of said irradiation, an F.I.D. signal is generated. Thus, by opening gate circuit 24 immediately after said irradiation, said F.I.D. signal picked up by trans-receiver coil 1 is amplified and detected by the $^{13}$C resonance frequency receiving system 25 prior to being supplied to the A-D converter 27 where A-D conversion takes place. That is to say, a digital signal is produced in accordance with an out of phase signal, as shown in FIG. 3(g), sent from the pulse programmer 28. Accordingly, the signal supplied to the $^{13}$C resonance frequency receiving system 25 is not affected by the $^1$H decoupling irradiation wave. Finally, the digitalized signal produced in the A-D converter 27 is processed in C.P.U. 29, D-A converted in the D-A converter 30 and displayed on the display means 31 as a spectral waveform, as shown in FIG. 4B(b). Thus, by using the selective $^1$H decoupling technique on the Si(CH$_3$)$_4$, the $^{13}$C absorption line peak of T.M.S. appears as a singlet.

Furthermore, when observing $^1$H by selectively decoupling $^1$H of CH$_3$, the changeover switch 26 is positioned at "b", next the gate circuit 22 is closed and gate circuits 33 and 38 are opened by supplying gate signals thereto. Next the oscillation frequency of the second $^1$H resonance frequency oscillator 35 is shifted so as to make waveform A overlap the peak position of the CH$_3$ radical, while observing the $^1$H observation spectrum on the display means 31. Then, an $^1$H observation spectrum obtained by selectively decoupling $^1$H of CH$_3$ radical, as shown in FIG. 4C(a), is displayed on the display means 31.

When observing $^{13}$C by selectively decoupling $^1$H of CH$_3$, the changeover switch 26 is positioned at "a" while the oscillation frequency of the second $^1$H resonance frequency oscillator 35 is maintained constant. Further, by closing gate circuit 33 and opening gate circuits 22 and 24, a $^{13}$C observation spectrum obtained by selectively decoupling $^1$H of CH$_3$ radical, as shown in FIG. 4C(b), is displayed on the display means 31.

In the same way as herefore described, an $^1$H observation spectrum obtained by selectively decoupling $^1$H of CH$_2$ radical, as shown in FIG. 4D(a), and a $^{13}$C observation spectrum obtained by selectively decoupling $^1$H of CH$_2$ radical, as shown in FIG. 4D(b), can be displayed easily by shifting the oscillation frequency of the second $^1$H resonance frequency oscillator 35 and throwing switch 26, etc.

Thus, in the apparatus aforedescribed, $^1$H and $^{13}$C nucleus observation, $^1$H observation by $^1$H decoupling, $^{13}$C observation by $^1$H decoupling, etc. can readily be carried out by using the Fourier transform method without having to exchange the trans-receiver coil or remove the $^2$D internal lock condition. Accordingly, various kinds of adjustment, in addition to resolution adjustment, can be carried out easily and accurately. Furthermore, since $^1$H and $^{13}$C observations by $^1$H decoupling can be carried out under identical measuring conditions simply by throwing a switch, verification of which peak in the $^{13}$C observation spectrum corresponds to which radical becomes very much easier, especially when carrying out selective decoupling by comparing both spectra.

In the above described embodiment, a filter circuit for improving the S/N ratio of the observation signal and a sample hold circuit for preventing a drop in the effective detection intensity of the signal when carrying out timesharing measurements, etc. are practical techniques not explained herein.

In the above described embodiment, the $^2$D lock trans-receiver coils and $^1$H transmission coils are separately arranged along the same axis. However, by utilizing coils double tuned to the $^2$D resonance and $^1$H resonance frequencies, and by connecting these coils to the $^2$D transmitting system, $^2$D receiving system and $^1$H transmitting system and further by arranging a means in front or at the rear of the $^2$D receiving system for exclusively selecting the resonance signal induced in the coils when the sample is not irradiated by the $^1$H decoupling RF pulses, the $^2$D lock trans-receiver coils and $^1$H transmission coils can be unified.

Further, in the embodiment described above, the trans-receiver coil 1 is a double tuning coil for tuning both the $^1$H and $^{13}$C resonance frequencies. Accordingly, in this case, when observing the $^{13}$C nucleus by $^1$H decoupling, the $^1$H decoupling irradiation wave is intermittently irradiated and, moreover, the detection timing of the $^{13}$C resonance signal is timeshared so as not to coincide with the irradiation timing. The following are described various embodiments designed to enable the observation of the $^{13}$C nucleus by $^1$H decoupling without using the time sharing method.

In other words, embodiments without using the means for exclusively selecting the F.I.D. signal induced in the trans-receiver coil 1 when the sample is not irradiated by the $^1$H decoupling RF pulses, are described hereafter.

In these embodiments, the structure other than a probe of the apparatus is similar to that of the embodiment described in FIGS. 1 and 2, except that the means for exclusively selecting the F.I.D. signal above described is omitted. Therefore, only the probe is explained hereafter in these embodiments.

One such embodiment is shown in FIG. 5. Referring to the figure, 44 and 45 are terminals for supplying signals from the $^1$H and $^{13}$C gyromagnetic resonance frequency oscillators respectively. $C_1, C_2 \ldots C_9$ are double tuning condensers of which $C_5$, having a relatively large capacity, serves to tune the $^{13}$C resonance frequency and $C_6$ and $C_7$, having relatively small capacities, are mainly used to tune the $^1$H resonance frequency. Diode gates 46 and 47 are activated ("on") during the time radio frequency pulses are being supplied to terminals 44 and 45 and remain deactivated ("off") during the time no radio frequency pulses are being supplied to said terminals. Terminals 48 and 49 are for supplying the $^1$H and $^{13}$C resonance frequency F.I.D. signal respectively, to the final stages of an amplifying system. Terminals 50 and 51 are for supplying the signal for irradiating the $^1$H decoupling radio frequency signal via the transmission coils 15, and the $^2$D resonance frequency signal via the trans-receiver coils 10 respectively. Terminal 52 connects the incoming $^2$D resonance frequency signal to an amplifying system. Variable condenser $C_8$ forming part of the trans-receiver coil 1 tuning circuit, selects two capacities, one for tuning the $^1$H resonance frequency and the other for tuning the $^{13}$C resonance frequency.

FIG. 6 shows a cross-section of condenser $C_8$. In the figure, 53a and 53b are annular electrodes placed around an insulator 54, said insulator 54 being clamped to a support frame 55. Conductor 56 forming one end of a rod 57 constitutes, in conjunction with said electrodes 53a and 53b, the dielectric portion of condenser $C_8$. The rod 57 is held by frames 55 and 58 but can rotate and slide backwards and forwards freely. A fan-shaped member 59 is secured to the rod 57 at about the midway point along its length and a manipulating knob 60 is attached to the external end of the rod. A spring 61 is wound onto the rod 57 between frame 58 and knob 60. The rod 57 is inserted into the insulator 54 by pushing knob 60 in the direction of the arrow and is held in the inserted position by tuning knob 60; in which case, the adjustment screw 62 clamped to frame 58 locks the member 59, thus preventing the rod 57 from returning. The rod is returned to its pre-inserted position by turning knob 60 so as to release member 59 held by screw 62. By so doing, the spring 61 expands forcing the rod to shift in the direction opposite to that of the arrow. An adjustable stop screw 63 is provided so as to determine optionally the extent to which the rod is inserted into the dielectric portion of the condenser. In other words, by adjusting screws 62 and 63, the capacity of condenser $C_8$ can be varied as desired.

Thus, when observing the $^{13}$C nucleus by $^1$H decoupling, the rod 57 is fully inserted in the dielectric portion of condenser $C_8$ to increase the capacity and thereby increase the capacitive reactance of the double tuning circuit. By so doing, the $^1$H resonance frequency signal is suppressed and the selectively tuned $^{13}$C resonance frequency signal is detected as a high sensitivity signal. Conversely, when observing the $^1$H nucleus, the rod 57 is positioned so as to decrease the capacity of condenser $C_8$ and thereby decrease the capacitive reactance of the double tuning circuit. Hence, the $^{13}$C signal is suppressed and the $^1$H signal is picked up under optimum conditions.

FIG. 7 shows a further embodiment according to this invention. In the figure, switch 64 is used for changing over between $^{13}$C observation and $^1$H observation, the 65 pin position being for $^1$H observation and the 66 pin position for $^{13}$C observation. The high frequency signal for $^1$H decoupling is supplied via terminal 67 to transmission coils 15 and the $^2$D resonance frequency signal is supplied via terminal 68 to trans-receiving coils 10. Terminal 69 is for supplying the $^2$D gyromagnetic resonance signal to an amplifying system and terminal 70 is for introducing the $^{13}$C gryromagnetic resonance high frequency signal and supplying it to trans-receiver coil 1 via diode gate 71 and switch 64. Trans-receiver coil 1 which together with condenser 72 constitutes the main tuning circuit serves to tune the $^{13}$C gyromagnetic resonance frequency, and the incoming $^{13}$C gyromagnetic signal is introduced into a $^{13}$C receiving system via terminal 73. Diode gates 71 and 74 remain closed except during the time a high frequency pulse is being supplied to terminal 70. However, during the time the diode gate 74 is closed, each of the four diodes constituting said gate function as capacitive elements. Such being the case, when the gate is open, the tuning frequency of the circuit differs slightly from the $^{13}$C gyromagnetic resonance frequency. To compensate for this difference, a coil 75 has been provided, thereby keeping the circuit under resonance conditions at all times. The $^1$H resonance frequency pulse is introduced via terminal 76 and supplied to trans-receiver coil 1 via diode gate 77 and switch 64. The main tuning circuit comprising coil 1, condenser 78 and compensating coil 79 serves to tune the $^1$H resonance frequency and the $H_0$ gyromagnetic resonance signal is supplied to an amplifying system via terminal 80. Here too, when the diode gate 81 is closed, each of the four diodes constituting said gate function as capacitive elements. Hence, as in the case of the $^{13}C$ gyromagnetic resonance frequency gate diode circuit, a coil 82 has been provided to compensate for the slight discrepancy between the $^1H$ gyromagnetic resonance and tuning frequencies when the gate is open; that is to say, when a pulse is supplied to said gate.

In the above-described embodiment, for example, in the case of $^{13}C$ observation by $^1H$ decoupling, switch 64 is positioned at pin 66 and the $^{13}C$ resonance frequency pulse is fed in through terminal 70 while the high frequency decoupling signal is being fed in through 67. As a result, the F.I.D. signal from trans-receiver coil 1 is detected a high sensitivity and supplied to the final stage of a $^{13}C$ resonance frequency signal amplifier (not shown) via terminal 73. Thus, even if there is $^1H$ decoupling signal leakage, the high frequency component attributable to said leakage is suppressed and therefore not detected. On the other hand, in the case of $^1H$ observation, switch 64 is positioned at pin 65 and the $^1H$ resonance frequency signal is fed in through terminal 76. As a result, the F.I.D. signal from trans-receiver coil 1 is picked up and supplied to an $^1H$ resonance frequency signal amplifier (not shown) via terminal 80.

In the embodiment shown in FIG. 8, the trans-receiving coils 10 have been dispensed with. To enable this, an extra switch 84 has been provided, said switch 84 being interlocked with switch 64. That is to say, when switch 64 is positioned at pin 66, switch 84 is positioned at pin 87 and conversely, when switch 64 is positioned at pin 65, switch 84 is positioned at pin 88. In this case, when observing the $^{13}C$ nucleus, switch 64 is positioned at pin 66 and switch 84 is positioned at pin 87. As a result, trans-receiver coil 1 is not only tuned to the $^{13}C$ resonance frequency but also to the $^2D$ resonance frequency by the action of the trap circuit comprising coil 89 (which is tuned to the $^{13}C$ resonance frequency) and condenser 90, and condenser 91. In this case, the $^2D$ gyromagnetic resonance frequency is fed in through terminal 68 and the $^2D$ resonance signal is supplied to an amplifying system via terminal 69. Moreover, since trans-receiver coil 1 is not tuned to the radio frequency decoupling signal fed in through terminal 67, there is no leakage effect. On the other hand, when observing the H nucleus, switch 64 is positioned at pin 65 and switch 84 is positioned at pin 88. As a result, trans-receiver coil 1 is tuned to the $^2D$ resonance frequency by the action of the trap circuit comprising coil 92 (which is tuned to the $^1H$ resonance frequency) and condenser 93, and condenser 94. In this case also, the $^2D$ resonance frequency wave is fed in through terminal 68 and the $^2D$ resonance signal is supplied to an amplifying system via terminal 69.

In the embodiments described in FIGS. 5 through 8, $^1H$ observation by $^1H$ decoupling can be carried out in the same way as described in FIGS. 1 through 4.

This invention is not limited to $^1H$ and $^{13}C$ observation. Observations of $^1H$ and $^{31}P$ by $^1H$ decoupling, $^{19}F$ and $^{13}C$ by $^{19}F$ decoupling. $^{19}F$ and $^{31}P$ by $^{19}F$ decoupling, $^{31}P$ and $^{13}C$ by $^{31}P$ decoupling and $^{31}P$ and $^{19}F$ by $^{31}P$ decoupling are also feasible.

Further, in the embodiment shown in FIG. 2, oscillators for supplying the $^1H$, $^{13}C$, and $^2D$ resonance RF waves are shown separately in order to simplify explanation. However, in actual fact, a frequency synthesizer, complete with a master oscillator, is used to provide said RF waves.

Furthermore, in the above described embodiments, the decoupling wave is irradiated intermittently so as to pulse decouple $^1H$. However, when observing $^{13}C$ by $^1H$ decoupling, a continuous wave or a noise modulated continuous decoupling wave can be utilized and the F.I.D. signal can be fed into $^{13}C$ resonance frequency receiving system 25 via gate which is "open."

Having thus described our invention with the detail and particularity as required by the patent laws, what is desired protected by Letters Patent is set forth in the following claims.

We claim:

1. In a nuclear magnetic resonance apparatus for producing two types of spectrums the improvements comprising:
   a. a trans-receiver coil arranged perpendicularly with respect to the static magnetic field $H_0$,
   b. an internal lock trans-receiver coil interposed along a third axis perpendicular to both the static magnetic field $H_0$ and said trans-receiver coil axis,
   c. a transmission coil arranged along the same axis as the internal lock trans-receiver coil,
   d. a means for tuning said trans-receiver coil to a first nuclear resonance frequency or a second nuclear resonance frequency,
   e. a transmitting means for supplying said trans-receiver coil or transmission coil with a burst first nuclear resonance RF,
   f. a first receiving means for amplifying and detecting a first nuclear resonance F.I.D. signal induced in said trans-receiver coil by the burst of said first RF said first receiving means being connected to said trans-receiver coil via tuning means,
   g. a transmitting means for supplying said trans-receiver coil via said tuning means with a burst of a second nuclear resonance RF,
   h. a second receiving means for amplifying and detecting the second nuclear resonance F.I.D. signal induced in said trans-receiver coil, said second receiving means being connected to said trans-receiver coil via said tuning means,
   i. a transmitting means for supplying said internal lock trans-receiver coil with a third nuclear resonance RF,
   j. a third receiving means for amplifying and detecting a third nuclear resonance signal induced in said internal lock trans-receiver coil, said third receiving means being connected to said internal lock trans-receiving coil and to a means for stabilizing the static magnetic field,
   k. an adjustable transmitting means for supplying said transmission coil with a nuclear RF pulse so as to decouple a selected nucleus,
   l. a means for Fourier transforming the output signal from said first or second receiving means, and
   m. a means for displaying said Fourier transformed signals whereby the adjustable transmitting means may be adjusted until observation of decoupling of a selected nucleus on one Fourier transformed spectrum and then the other spectrum may be observed with the selected nucleus decoupled without change of apparatus conditions.

2. An apparatus according to claim 1 wherein said tuning means is a tuning circuit provided with a means for varying the reactance of the circuit depending on the nucleus to be observed.

3. An apparatus according to claim 1 wherein said tuning means comprises a first tuning circuit for tuning said trans-receiver coil to the first nuclear resonance frequency, a second tuning circuit for tuning said trans-receiver coil to the second nuclear resonance frequency, and a changeover switch for changing over the tuning circuit connected to said trans-receiver coil.

4. In a nuclear magnetic resonance apparatus for producing two types of spectrums, the improvements comprising:
   a. a trans-receiver coil arranged perpendicularly with respect to the static magnetic field $H_0$,
   b. an internal lock trans-receiver coil interposed along a third axis perpendicular to both the static magnetic field $H_0$ and said trans-receiver coil axis,
   c. a transmission coil arranged along the same axis as the internal lock trans-receiver coil,
   d. a double tuned circuit connected to said trans-receiver coil for tuning said coil to first and second nuclear resonance frequencies,
   e. a transmitting means for supplying said trans-receiver coil or transmission coil with a burst of said first nuclear resonance RF,
   f. a first receiving means for amplifying and detecting a first nuclear resonance F.I.D. signal induced in said trans-receiver coil, by the burst of said first RF, said first receiving means being connected to said transmission coil via said double tuned circuit,
   g. a transmitting means for supplying said trans-receiver coil via said double tuned circuit with a burst of a second nuclear resonance RF,
   h. a second receiving means for amplifying and detecting the second nuclear resonance F.I.D. signal induced in said trans-receiver coil, said second receiving means being connected to said trans-receiver coil via said double tuned circuit,
   i. a transmitting means for supplying said internal lock trans-receiver coil with the third nuclear resonance RF,
   j. a third receiving means for amplifying and detecting a third nuclear resonance signal induced in said internal lock trans-receiver coil, said third receiving means being connected to said internal lock trans-receiver coil and to a means for stabilizing the static magnetic field,
   k. an adjustable transmitting means for supplying transmission coil with a nuclear resonance RF pulse intermittently so as to decouple a selected nucleus,
   l. a means for exclusively selecting the second nuclear resonance F.I.D. signal induced in said trans-receiver coil during the time when said transmission coil does not transmit an RF pulse,
   m. a means for Fourier transforming the output signal from said first or second receiving means,
   n. a means for displaying said Fourier transformed signals whereby the adjustable transmitting means may be adjusted until observation of decoupling of a selected nucleus on one Fourier transformed spectrum and then the other spectrum may be observed with the selected nucleus decoupled without change of apparatus conditions.

5. In a nuclear magnetic resonance apparatus for producing two types of spectrums the improvements comprising:
   a. a first trans-receiver coil arranged perpendicularly with respect to the static magnetic field $H_0$,
   b. a second trans-receiver coil being interposed along a third axis perpendicular to both the static magnetic field $H_0$ and said trans-receiver coil axes, said second trans-receiver coil being double tuned to the first and third nuclear resonance frequencies,
   c. a means for tuning said first trans-receiver coil to the first nuclear resonance frequency or a second nuclear resonance frequency;
   d. a transmitting means for supplying said first trans-receiver coil via said tuning means with a burst of a first or second nuclear resonance RF,
   e. a first receiving means for amplifying and detecting a first nuclear resonance F.I.D. signal induced in said first trans-receiver coil, said first receiving means being connected to said trans-receiver coil via said tuning means,
   f. a transmitting means for supplying said first trans-receiver coil via said tuning means with the second nuclear resonance RF pulse,
   g. a second receiving means for amplifying and detecting a second nuclear resonance F.I.D. signal induced in said first trans-receiver coil, said second receiving means being connected to said trans-receiver coil via said tuning means,
   h. a transmitting system for supplying said second trans-receiving coil with the third nuclear resonance RF,
   i. a third receiving means for amplifying and detecting a third nuclear resonance signal induced in said second trans-receiver coil, and third receiving means being connected to a means for stabilizing the static magnetic field,
   j. an adjustable transmitting means for supplying said second trans-receiver coil with the nuclear resonance RF burst intermittently so as to decouple a selected nucleus,
   l. a means for Fourier transforming the output signal from said first or second receiving means,
   m. a means for displaying said Fourier transformed signals whereby the adjustable transmitting means may be adjusted until observation of a selected nucleus on one Fourier transformed spectrum and then the other spectrum may be observed with the selected nucleus decoupled without change of apparatus conditions.

6. An apparatus according to claim 5 wherein said tuning means is a tuning circuit provided with a means for varying the reactance of the circuit depending on the nucleus to be observed.

7. An apparatus according to claim 5 wherein said tuning means comprises a first tuning circuit for tuning said first trans-receiver coil to the first nuclear resonance frequency, a second tuning circuit for tuning said trans-receiver coil to the second nuclear resonance frequency, and a changeover switch for changing over the tuning circuit connected to said first trans-receiver coil.

8. In a nuclear magnetic resonance apparatus for producing two types of spectrums the improvements comprising:
   a. a first trans-receiver coil arranged perpendicularly with respect to the static magnetic field $H_0$, said first trans-receiver coil being double tuned to the first and second nuclear resonance frequencies,
   b. a second trans-receiver coil for an internal lock being interposed along a third axis perpendicular to both the static magnetic field $H_0$ and said trans-receiver coil axis, said second trans-receiver coil being a third nuclear resonance frequency,
   c. a transmitting means for supplying said first trans-receiver coil via said tuning means with bursts of a first or second nuclear resonance RF, d. a first receiving means connected to said first trans-receiver coil for amplifying and detecting a first nuclear resonance F.I.D. signal induced in said first trans-receiver coil, e. a second transmitting means for supplying said first trans-receiver coil with a burst of a second nuclear resonance RF, f. a second receiving means connected to said first trans-receiver coil for amplifying and detecting a second nuclear resonance F.I.D. signal induced in said first trans-receiver coil said second receiving means being connected to said trans-receiver coil, g. a transmitting means for supplying said second trans-receiver coil with a burst of said third nuclear resonance RF, h. a third receiving means for amplifying and detecting a third nuclear resonance signal induced in said second trans-receiver coil, said third receiving means being connected to said internal lock trans-receiver coil and to a means for stabilizing the static magnetic field, i. an adjustable transmitting means for supplying said second trans-receiver coil with an intermittent RF burst to decouple a selected nucleus, j. a means for introducing and detecting the nuclear resonance F.I.D. signals induced in said first trans-receiver coil when the RF pulse for decoupling the selected nucleus is or is not applied, k. a means for Fourier transforming the output signal from said first or second receiving means, l. a means for displaying said Fourier transformed signals where by the adjustable transmitting means may be adjusted until observation of decoupling of a selected nucleus on one Fourier transformed spectrum and then the other spectrum may be observed with the selected nucleus decoupled without change of apparatus conditions.

9. In a nuclear magnetic resonance apparatus for producing two types of spectrums for improvements comprising:

a. a trans-receiver coil arranged perpendicularly with respect to the static magnetic field $H_0$, b. a transmission coil interposed along a third axis perpendicular to both the static magnetic field $H_0$ and said trans-receiver coil axis, c. a means for double tuning said trans-receiver coil to first and third nuclear resonance frequencies or to second and third nuclear resonance frequencies, d. a transmitting means for supplying said trans-receiver coil or said transmission coil with a burst of the first nuclear resonance frequency RF via said double tuning means, e. a first receiving means for amplifying and detecting the first nuclear resonance F.I.D. signal induced in said trans-receiver coil and supplied via said double tuning means, said first receiving means being connected to said trans-receiver coil via said double tuning means, f. a transmitting means for supplying said trans-receiver coil with a burst of the second nuclear resonance RF via said double tuning means, g. a second receiving means for amplifying and detecting the second nuclear resonance F.I.D. signal induced in said trans-receiver coil and supplied via said double tuning means, said second receiving means being connected to said trans-receiver coil via said double tuning means, h. a transmitting means for supplying said trans-receiver coil with a burst of the third nuclear resonance RF, i. a third receiving means for amplifying and detecting the third nuclear resonance signal induced in said trans-receiver coil and supplied via said double tuning means, said third receiving means being connected to said trans-receiver coil and to a means for stabilizing the static magnetic field, j. an adjustable transmitting means for supplying said transmission coil with a burst of first nuclear resonance RF pulse intermittently, k. a means for Fourier transforming the output signal from said first or second receiving means, l. a means for displaying said Fourier transformed signals whereby the adjustable transmitting means may be adjusted until observation of decoupling of a selected nucleus on one Fourier transformed spectrum and then the other spectrum may be observed with the selected nucleus decoupled without change of apparatus conditions.

10. An apparatus according to claim 9 wherein said double tuning means comprises a first double tuning circuit for tuning said trans-receiver coil to the first and the third nuclear resonance fequencies, a second double tuning circuit for tuning said trans-receiver coil to the second and the third nuclear resonance frequencies, and a switch for changing over said two double tuning circuits.

11. An apparatus according to claim 1 in which each receiving means comprises a mixer to which the NMR signals and the signal inducing said signals are applied to produce an intermediate frequency signal.

12. An apparatus according to claim 4 in which each receiving means comprises a mixer to which the NMR signals and the signal inducing said signals are applied to produce an intermediate frequency signal.

13. An apparatus according to claim 5 in which each receiving means comprises a mixer to which the NMR signals and the signal inducing said signals are applied to produce an intermediate frequency signal.

14. An apparatus according to claim 8 in which each receiving means comprises a mixer to which the NMR signals and the signal inducing said signals are applied to produce an intermediate frequency signal.

15. An apparatus according to claim 9 in which each receiving means comprises a mixer to which the NMR signals and the signal inducing said signals are applied to produce an intermediate frequency signal.

* * * * *